United States Patent [19]

Thomsen et al.

[11] Patent Number: 5,065,042

[45] Date of Patent: Nov. 12, 1991

[54] SELF-CONFIGURING CLOCK INTERFACE CIRCUIT

[75] Inventors: Joseph A. Thomsen, Chandler; Richard W. Ulmer, Tempe, both of Ariz.

[73] Assignee: VLSI Technology, Inc., San Jose, Calif.

[21] Appl. No.: 562,064

[22] Filed: Aug. 1, 1990

[51] Int. Cl.[5] .......................... H03L 7/00; H03K 5/22; H03K 21/02; H03K 21/08
[52] U.S. Cl. .................................... 307/269; 307/471; 328/110; 377/111; 377/114
[58] Field of Search ................. 377/111, 114; 307/269, 307/471; 328/110

[56] References Cited

U.S. PATENT DOCUMENTS 4,658,406 4/1987 Pappas .................................. 377/114
4,700,370 10/1987 Banerjee et al. ..................... 377/111

Primary Examiner—Stanley D. Miller
Assistant Examiner—Trong Phan
Attorney, Agent, or Firm—LaValle D. Ptak

[57] ABSTRACT

A self-configuring clock interface circuit automatically configures itself according to the type of clock input signals applied to two input terminals interconnected with the interface circuit. The system includes a pair of counters connected to the input terminals and having their outputs connected to the two inputs of an Exclusive NOR gate which acts as a control device for the system. The output of the exclusive NOR gate is coupled to a 2:1 multiplex to control the interconnection of one or the other of two inputs to the multiplex circuit with a clock output for the interface circuit.

15 Claims, 1 Drawing Sheet

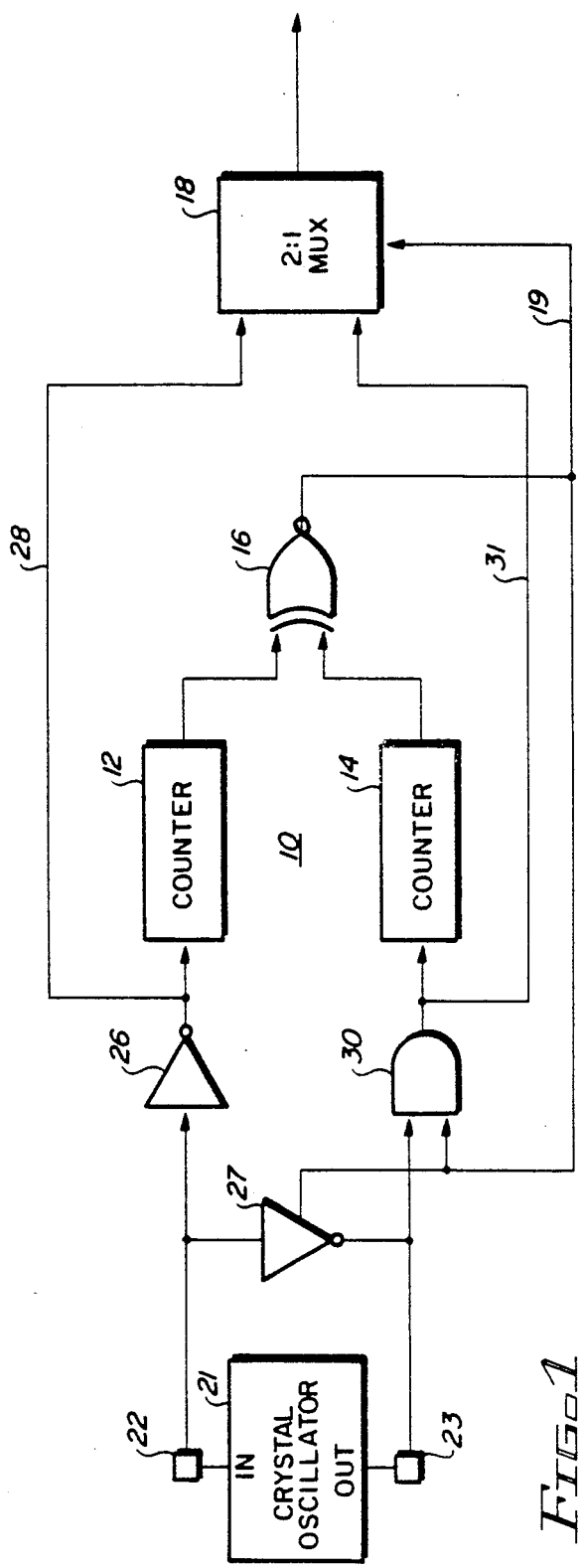
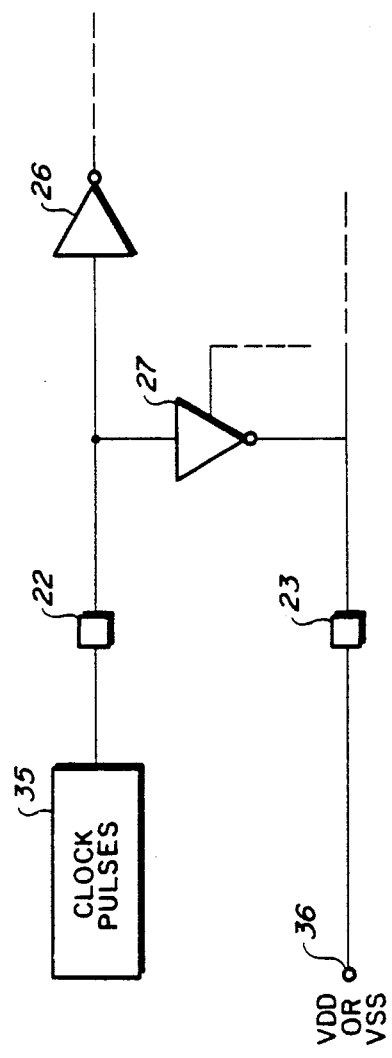
Fig. 1
Fig. 2

SELF-CONFIGURING CLOCK INTERFACE CIRCUIT

BACKGROUND

Large scale integrated circuit systems have been developed for performing a variety of circuit functions in conjunction with different types of input and output devices. Situations exist where one manufacturer of systems incorporating such integrated circuit devices utilizes an external crystal oscillator as a source of clock inputs for the system. When such an external crystal oscillator clock is employed, the feedback loop for the clock is interconnected between two different output terminals or pins on the circuit which is to be driven by the clock. In other situations, however, a different source of clock signals is employed which is connected to only one of these pins, and the other pin is connected directly to a fixed potential, which typically is VDD or VSS.

Clearly, if the internal clock interface circuit portion of the integrated circuit to which the system device pins are connected is configured for one or the other of these possible clock signal input connections, it will not operate properly if the other clock signal input connection is used. For example, if the internal circuitry of the chip for distributing the clock signals to other components of the integrated circuit is configured with interconnections to the bonding pads connected to the output pins for operating in the feedback loop of a crystal oscillator clock, the tying of one or the other of these pins to a constant potential, will prevent the clock signals from being recognized or utilized within the internal circuit of the chip. The converse also is true. If the internal configuration of the clock pulse distribution circuit is made to function properly with a source of clock signals connected to a single terminal, with the other of two output pins tied to a fixed potential, the interconnection of a crystal oscillator feedback loop across the two pins will result in failure of operation of the system.

In the past, it has been necessary to configure the interface circuit between the clock input pins and the internal circuit of the chip, specifically for the type of clock input signal source which is to be used with the system. As mentioned above, if the clock interface circuit is configured for one type of clock input, it will not function properly for another type of clock input.

It is desirable to provide a clock input interface circuit which automatically identifies the external clock connected to the input pins, and which automatically self-configures to provide a proper clock signal to the remainder of the circuit with which the interface is used.

SUMMARY OF THE INVENTION

Accordingly, it is an object of this invention to provide a multi-purpose signal interface circuit.

It is another object of this invention to provide an improved clock signal interface circuit.

It is an additional object of this invention to provide an improved self-configuring clock signal interface circuit.

It is a further object of this invention to provide an improved clock signal interface circuit capable of being driven by a crystal oscillator, or an external clock, and which automatically self-configures to distribute clock pulses.

In accordance with a preferred embodiment of the invention, a 2:1 multiplex circuit is switched to supply the clock signals appearing on the one or the other of its two inputs to an output in accordance with the output of a control gate, which operates the multiplex circuit. Two inputs to the multiplex circuit are connected, respectively, to first and second bonding pads which are connected to clock interface input terminals for the system. The clock input signals also are applied to first and second counters, respectively, the outputs of which control the state of operation initial reset, the first counter counts for a pre-determined number of clock pulses. At the end of this time, the output of the second counter is sampled to determine if it also has been clocked by the clock pulses. If the second counter has advanced to a predetermined count, this indicates either that a crystal is connected across the two input bonding pads or terminals, or that there is no connection of a crystal to the second of these bonding pads or terminals. In any event, the control gate selects the proper input to the 2:1 multiplex to provide the desired output pulses. If the second counter does reach a pre-determined count, the control gate operates to select the other input to the 2:1 multiplex.

BRIEF DESCRIPTION OF THE DRAWING

FIG. 1 is a detailed block circuit diagram of a preferred embodiment of the invention, illustrating one possible connection of clock input signals; and FIG. 2 is partial block diagram of the circuit of FIG. 1, showing a different signal input connection.

DETAILED DESCRIPTION

Reference now should be made to the drawing in which the same reference numbers are used in both figures to designate the same or similar components. FIG. 1 is a block circuit diagram of a self-configuring clock interface circuit in accordance with a preferred embodiment of the invention. To control the automatic configuration operation, the circuit of FIG. 1 includes a first digital counter 12, which counts N clock pulses, after an initial reset (where N is a positive integer). In a system which actually has been built, the counter 12 counts sixteen input pulses prior to producing an output indicative of the count. A second counter 14 has a smaller count capacity than the counter 12. In the system under consideration, the counter 14 has a count capacity of 8; so that it counts eight input clock pulses prior to producing an output.

The outputs of the counters 12 and 14 are connected to the two inputs of an Exclusive NOR gate 16; so that when both gate input signals are the same, the output of the Exclusive NOR gate 16 is "high," and when the two gate inputs, obtained from the outputs of the counters 12 and 14, are different, the output of the exclusive NOR gate 16 is "low."

The Exclusive NOR gate 16 operates as a control gate to apply signals over lead 19 to a 2:1 switchable multiplex circuit 18 to select one or the other of two inputs to the multiplex circuit 18 for connection to the output terminal thereof. In the configuration shown in FIG. 1, when the output of the Exclusive NOR gate 16 is "high," the lower input provided on a lead 31 to the multiplex circuit 18, is interconnected with the multiplex output. Conversely, when the output of the Exclusive NOR gate 16 is "low," the upper input to the multiplex circuit 18, provided on an input lead 28, is interconnected with its output.

Clock signals for the circuit are connected to a pair of input terminals or bonding pads 22 and 23, which are connected, respectively, to external pins on the integrated circuit of which the interface 10 of FIG. 1 is a part. One typical configuration is for a crystal oscillator 21 to be connected with its input connected to the terminal 22 and its output connected to the terminal 23. This is the feedback loop of the oscillator. The terminal 22 is connected directly to an inverter amplifier 26, which provides the input pulses to the counter 12, and which also provides the clock pulses on the lead 28 to the upper input of the multiplex circuit 18.

The output terminal of the crystal oscillator 21 is connected to the bonding pad 23, which provides one input to a two-input AND gate 30. The other input of the AND gate is obtained from the output of the exclusive NOR gate 16. In the initial, start-up condition of operation of the system, with both counters 12 and 14 reset, this output from the exclusive NOR gate 16 is a high or enabling input to the AND gate 30. Thus, the AND gate 30 will pass any pulses appearing on its upper input.

The AND gate 30 also has the upper input connected to the output of a three-state inverter amplifier 27, which is interconnected between the terminals 22 and 23. The three-state inverter amplifier 27 is placed in its operative low impedance state when the output of the exclusive NOR gate 16 is "high." Thus, at initial circuit start-up, the three-state inverter amplifier 27 is operative to pass any pulses appearing on its input through to the AND gate 30.

As mentioned above, when the counters 12 and 14 initially are reset, both of them have a low signal output. When both of the outputs of the counters 12 and 14 are low, the exclusive NOR gate 16 provides a high output to cause the multiplex circuit 18 to interconnect the lead 31 to its output terminal, and to enable the tri-state amplifier inverter 27 and the AND gate 30. If the crystal oscillator 21 is connected across the terminals 22 and 23, pulses are applied through the inverter 26, from the terminal 22, to advance counter 12, and through the upper input of the AND gate 30, to advance the counter 14.

Since the counter 14 has a lower count capacity than the counter 12, an output is produced from the counter 14 prior to the production of an output from the counter 12. This causes the two inputs to the exclusive NOR gate 16 to be different; so that the output of the exclusive NOR gate 16 then drops to a "low" value. Pulses continue to be applied through the inverter 26, however, to cause the counter 12 to reach its full count, whereupon the output of the each NOR gate 16 once again goes high, enabling the amplifier inverter and the AND gate 30 for operation. This then establishes the steady state, or continuous state of operation, of the circuit. The multiplex circuit 18 then interconnects input pulses from the output of the AND gate 30 on the lead 31 with the multiplex output.

If, instead of a crystal oscillator connected between the terminals 22 and 23, the terminal 23 simply is connected directly to receive clock pulses, and the terminal 23 is open circuited, the sequence of operation which has been described also takes place. At the end of the counts of both of the counters, 12 and 14, the pulses for passage through the multiplex circuit 18 are applied from the terminal 22 through the amplifier inverter 27, and the AND gate 30, for the duration of the operation of the system.

For both of the conditions of operation mentioned above, there is a momentary time period which takes place between the time the full count of the counter 14 is reached and the time the full count of the counter 12 is reached, when the pulses applied to the output of the multiplex circuit 18 are supplied over the lead 28 from the inverter 26. In the specific example which is under consideration, this amounts to only 8 clock pulses. This is the transitional or start-up time of the circuit, following its initial energization, or an initial reset, and constitutes only a very brief condition prior to attainment of the steady state condition with pulses supplied over the lead 31 through the multiplex circuit 18, as described above.

Reference now should be made to FIG. 2 for a different external circuit configuration which may be utilized by some designers in the circuit interconnections of the clock interface circuit which is shown in FIG. 1. Since the clock interface circuit does not change, the only portion which has been illustrated in FIG. 2 is the input portion connected to the terminals 22 and 23, and showing the inverters 26 and 27. For some circuit configurations, the terminal 23 may be connected to ground or to VDD. This then ties the upper terminal of the AND gate 30 either to ground (thereby disabling the AND gate), or to VDD which constitutes a steady state enabling potential for the AND gate 30. No pulses, however, are passed by the AND gate 30 in this condition, even though such pulses are passed through the amplifier inverter 27 during the start-up conditions of operation. Consequently, the counter 14 is not advanced.

The counter 12, however, continues to be advanced by the pulses of the output 26 until a full count is reached. When this condition is attained, the inputs to the exclusive NOR gate 16 are different, and remain different; so that the output of the exclusive NOR gate 16 goes low. In this condition of operation, the upper input to the multiplex circuit 18, applied over the lead 28, is interconnected with the output of the circuit 18.

Similarly, the low output from the exclusive NOR gate 16 disables the AND gate 30 and also causes the amplifier 27 to be driven to its high impedance state, or "off." Clock pulses for operating the circuit as applied to the terminal 22 from the source 35, then are applied directly through the inverter 26 and over the lead 28, through the multiplex circuit 18, to its output. From the foregoing, it is readily apparent that the system which has been described automatically re-configures itself to properly direct the clock pulses through the self-configuring interface circuit. Different types of gate arrangements and amplifiers may be used to accomplish the result which has been described. Also, the specific number or capacity of the counters 12 and 14 may be varied in accordance with desired operating conditions, including, but not limited to, necessary start-up times and the like for the circuit components with which the interface circuit 10 is used. Various other changes and modifications will occur to those skilled in the art without departing from the true scope of the invention, as defined in the appended claims.

We claim:

1. A self-configuring clock interface circuit including in combination:

a clock pulse output circuit means having first and second clock pulse inputs and a clock pulse output;

a first control means having first and second states of operation connected to said clock pulse output circuit means for selectively controlling said clock pulse output circuit means to interconnect the first input thereof with the output thereof for a first state of operation of said a first control means and to interconnect the second input of said clock pulse output circuit means with the output thereof for the second state of operation of said a first control means;

first and second separate interface input terminals for connection to an external source of clock signals;

first and second counter means, each having an output connected, respectively, to said a first control means, for controlling the state of operation thereof to said first state when said outputs of said first and second counter means are the same, and to said second state when the outputs of said first and second counter means are different;

first means interconnecting said first interface input terminal with the first input of said clock pulse output circuit means; and coincidence gate means having at least first and second inputs and an output, the first input thereof connected to said second interface input terminal and the output of said coincidence gate means connected to the input of said second counter means and to the second input of said clock pulse output circuit means, with the output of said a first control means connected to the second input of said coincidence gate means to selectively enable said coincidence gate means for operation when the outputs of said first and second counter means are the same, and for disabling said coincidence gate means when the outputs of said first and second counter means are different.

2. The combination according to claim 1 wherein said a first control means comprises a first gate means.

3. The combination according to claim 2 wherein said first counter means counts for n counts (where n is a positive integer greater than one) before producing and holding an output signal, and said second counter means counts to a count of less than n to produce and hold an output signal therefrom.

4. The combination according to claim 3 wherein n is an even number, and where the count of said second counter is n/2.

5. The combination according to claim 4 wherein said first means interconnecting said first interface input terminal with the first input of said clock pulse output circuit means comprises an amplifier means, with said amplifier means also connected to the input of said first counter means.

6. The combination according to claim 5 wherein said first gate means comprises an exclusive NOR gate.

7. The combination according to claim 6 wherein said coincidence gate means is an AND gate.

8. The combination according to claim 7 further including second control means interconnected between said first and second interface input terminals for selectively enabling the passage of signals from said first interface input terminal to said second interface input terminal, with said second control means selectively operated to pass such signals with said AND gate enabled and to block such signals with said AND gate disabled.

9. The combination according to claim 1 wherein said first counter means counts for n counts (where n is a positive integer greater than one) before producing and holding an output signal, and said second counter means counts to a count of less than n to produce and hold an output signal therefrom.

10. The combination according to claim 9 where n is an even number, and where the counter of said second counter is n/2.

11. The combination according to claim 1 wherein said first means interconnecting said first interface input terminal with the first input of said clock pulse output circuit means comprises an amplifier means, with said amplifier means also connected to the input of said first counter means.

12. The combination according to claim 1 wherein said coincidence gate means is an AND gate.

13. The combination according to claim 12 further including second control means interconnected between said first and second interface input terminals for selectively enabling the passage of signals from said first interface input terminal to said second interface input terminal, with said second control means selectively operated to pass such signals with said AND gate enabled and to block such signals with said AND gate disabled.

14. The combination according to claim 1 wherein said a first control means comprises a first gate means.

15. The combination according to claim 14 wherein said first gate means comprises an Exclusive NOR gate.

* * * * *